(12) United States Patent
Newkome et al.

(10) Patent No.: US 8,642,762 B2
(45) Date of Patent: Feb. 4, 2014

(54) METHODS FOR PRODUCING MATERIALS WITH PHOTO- AND ELECTROLUMINESCENCE PROPERTIES AND SYSTEMS USING SUCH MATERIALS

(75) Inventors: George R. Newkome, Medina, OH (US); Charles N. Moorefield, Akron, OH (US)

(73) Assignee: The University of Akron, Akron, OH (US)

( * ) Notice: Subject to any disclaimer, the term of this patent is extended or adjusted under 35 U.S.C. 154(b) by 0 days.

(21) Appl. No.: 13/565,923

(22) Filed: Aug. 3, 2012

(65) Prior Publication Data
US 2013/0029448 A1    Jan. 31, 2013

Related U.S. Application Data

(63) Continuation of application No. 12/438,873, filed as application No. PCT/US2007/076719 on Aug. 24, 2007, now abandoned.

(60) Provisional application No. 60/823,574, filed on Aug. 25, 2006.

(51) Int. Cl.
*C07F 3/06* (2006.01)
*H01L 51/50* (2006.01)

(52) U.S. Cl.
USPC .............................. 546/2; 313/504; 428/690

(58) Field of Classification Search
USPC .............................. 546/2; 313/504; 428/690
See application file for complete search history.

(56) References Cited

U.S. PATENT DOCUMENTS 7,811,675 B2 * 10/2010 Che et al. ...................... 428/690

OTHER PUBLICATIONS

Chen, X. et al.: Synthesis, structure and luminescence properties of Zinc complexes with terpyridine derivatives as ligands. Journal of Luminescence, vol. 126, pp. 81-90, 2007.*
Yu, S-C. et al.: Self-assembled electroluminescent polymers derived from terpyridine-based moieties. Adv. Materials, vol. 15, pp. 1643-1647, 2003.*
Wang, P. et al.: Synthesis, X-ray structure, and self-assembly of functionalized bis(2,2':6', 2'-terpyridinyl) arenes. Organic Letters, vol. 6, pp. 1197-1200, 2004.*

* cited by examiner

*Primary Examiner* — Charanjit Aulakh
(74) *Attorney, Agent, or Firm* — Renner, Kenner, Greive, Bobak, Taylor & Weber

(57) ABSTRACT

The invention is directed to a method of preparing polymeric metallomacrocycles having measurable photo- and electroluminescence properties and devices using such materials. In an embodiment, an O-hexyl-3,5-bis(terpyridine)phenol ligand has been synthesized and transformed into a hexagonal Zn(II)-metallomacrocycle by a facile self-assembly procedure capitalizing on terpyridine-Zn(II)-terpyridine connectivity. The material is usable in an OLED device based on the photo- and electro-luminescence characteristics thereof.

17 Claims, 4 Drawing Sheets

METHODS FOR PRODUCING MATERIALS WITH PHOTO- AND ELECTROLUMINESCENCE PROPERTIES AND SYSTEMS USING SUCH MATERIALS

RELATED APPLICATIONS

This application is a continuation application of application Ser. No. 12/438,873, filed on Feb. 25, 2009 now abandoned, which is a 371 national phase application of International (PCT) Application Serial No. PCT/US2007/-76719, filed on Aug. 24, 2007, which claims priority benefit of U.S. Provisional Application Ser. No. 60/823,574, filed on Aug. 25, 2006.

GRANT REFERENCE

The research carried out in connection with this invention was supported in part by a grant from the National Science Foundation (DMR-0401780, CHE-0420987, INT-0405242), the Air Force Office of Scientific Research (F49620-02-1-0428,02), and the Ohio Board of Regents for financial support. The Government has certain rights in the invention.

TECHNICAL FIELD

The present invention relates to the preparation of materials having photo and/or electroluminescence properties, and more particularly to polymeric metallomacrocycles having measurable photo- and electroluminescence properties and devices using such materials.

BACKGROUND OF THE INVENTION

The design of highly ordered supramolecular structures has attracted considerable interest in that the self-assembly of specifically tailored monomers possessing appropriate ligand directivity underpins the generation of novel and utilitarian supramolecular complexes with two- and three-dimensional nano- and macro-structures. Owing to their electronic and steric versatility, aromatic N-heterocycles continue to play a prominent role as classical ligands in coordination compounds, bridging ligands in binuclear derivatives, and building blocks for supramacromolecular assemblies. As a result of the connectivity of these polyheteroaromatics by transition metals, they also provide platforms for π-back-bonding and thus an opportunity for electron-delocalization and -transport as related to photon capture associated with light-energy conversion. More specifically, examples of self-assembled constructs have been reported based on the formation of stable transition metal complexes from tailored macromolecules. These types of transition metal complexes have also been applied to electroluminescence (EL) devices, since the fine tuning of the light-emitting properties can be achieved by structural modifications of the ligand or by using different transition metals. Light-emitting properties of some materials, which are composed of polymeric Rh(I) and Ru(II) bipyridine or Zn(II) terpyridine complexes, have also been reported.

One type of EL device is known as an organic light-emitting diode (OLED). An OLED is a thin-film light-emitting diode in which the emissive layer is an organic compound. OLED technology may be used to form picture elements in display devices. These devices could be much less costly to fabricate than traditional LCD displays. When the emissive electroluminescent layer is polymeric, varying amounts of OLEDs can be deposited in rows and columns on a screen using simple "printing" methods to create a graphical color display, for use as television screens, computer displays, portable system screens, and in advertising and information board applications to name a few.

An OLED works on the principle of electroluminescence. The key to the operation of an OLED is an organic luminophore. An exciton, which consists of a bound, excited electron and hole pair, is generated inside the emissive layer. When the exciton's electron and hole combine, a photon can be emitted. An exciton can be in one of two states, singlet or triplet. Only one in four excitons is a singlet. The materials currently employed in the emissive layer are typically fluorophors, which can only emit light when a singlet exciton forms, which reduces the OLED's efficiency. By incorporating transition metals into a small-molecule OLED, the triplet and singlet states can be mixed by spin-orbit coupling, which leads to emission from the triplet state.

It would be advantageous to provide a method of self-assembly of hexameric metallomacrocycles wherein the self-assembly process occurs by at least one metal-mediated moiety. It would also be advantageous to provide a method of self-assembly of hexameric metallomacrocycles, wherein the self-assembly process provides self-assembled structures having measurable photo- and electroluminescence properties and may be used in a light-emitting diode device.

SUMMARY OF THE INVENTION

According to the present invention, there is provided a method of preparing polymeric metallomacrocycles having measurable photo- and electroluminescence properties and devices using such materials. Other advantages and characteristics of the present invention are described in more detail below.

DETAILED DESCRIPTION OF THE INVENTION

Generally, the present invention provides a method of preparing self-assembly of hexameric metallomacrocycles, wherein the self-assembly process provides self-assembled structures having measurable photo- and electroluminescence properties and may be used in a light-emitting diode device. In a first embodiment, as will be described in relation to FIGS. 1 and 2, the self-assembly of hexameric metallomacrocycles, more specifically, this embodiment relates to the self-assembly of O-hexyl-3,5-bis(terpyridine)phenol ligand that has been synthesized and transformed into a hexagonal Zn(II)-metallomacrocycle by a facile self-assembly procedure capitalizing on terpyridine-Zn(II)-terpyridine connectivity.

Chemicals utilized in preparing the hexameric metallomacrocycles of the present invention were commercially purchased and used without further purification. Thin layer chromatography (TLC) was conducted on flexible sheets precoated with $Al_2O_3$ (IB-F) or $SiO_2$ (IB2-F) and visualized by UV light. Column chromatography was conducted using basic $Al_2O_3$, Brockman. Activity I (60-325 mesh) or SiO2 (60-200 mesh).

The initial O-hexyl-3,5-bis(terpyridine)phenol (1) was constructed from O-benzyl-3,5-diformylphenol by treatment with 2-acetylpyridine under standard conditions, followed by a Williamson synthesis with n-hexyl bromide. In particular, a mixture of 3,5-di(terpyridine)phenol (210 mg, 380 μmol) and $K_2CO_3$ (26 mg, 190 μmol) in MeCN (60 ml) was stirred at 25° C. for 30 min, then n-hexyl bromide (68 mg, 420 μmol) was added. The resultant suspension was refluxed for 10 h under $N_2$. The solvent was removed in vacuo to give a pale yellow oily residue, which was dissolved in $CHCl_3$, washed with water, and dried ($MgSO_4$) to afford a light yellow oil. This crude material was column chromatographed ($Al_2O_3$) eluting with $CHCl_3$, to give 1 (75%) as a white powder, which was subsequently recrystallized from a $CH_2Cl_2$/hexane mixture.

The structure was confirmed by $^1H$ NMR, which showed a triplet at 4.17 ppm ($OCH_2$) as well as peaks at 7.36 ppm (dd, 5,5"-tpyH), 8.70 (d, 3,3"-tpyH), 8.79 (s, 3',5'-tpyH), and 8.75 ppm (d, 6,6"-tpyH) attributed to the terpyridinyl moieties and the presence of the definitive number and position of the other peaks in the $^{13}C$ NMR; a mass peak (ESI-MS) appearing at m/z 641.5 amu ($M^+$+H, 100%) further confirmed the structure. $^1H$ and $^{13}C$ NMR spectra were recorded on a 300 NMR MHz spectrometer. Mass spectra were obtained on an Electrospray Ion Trap mass spectrometer (ESI-MS).

Figure 1:
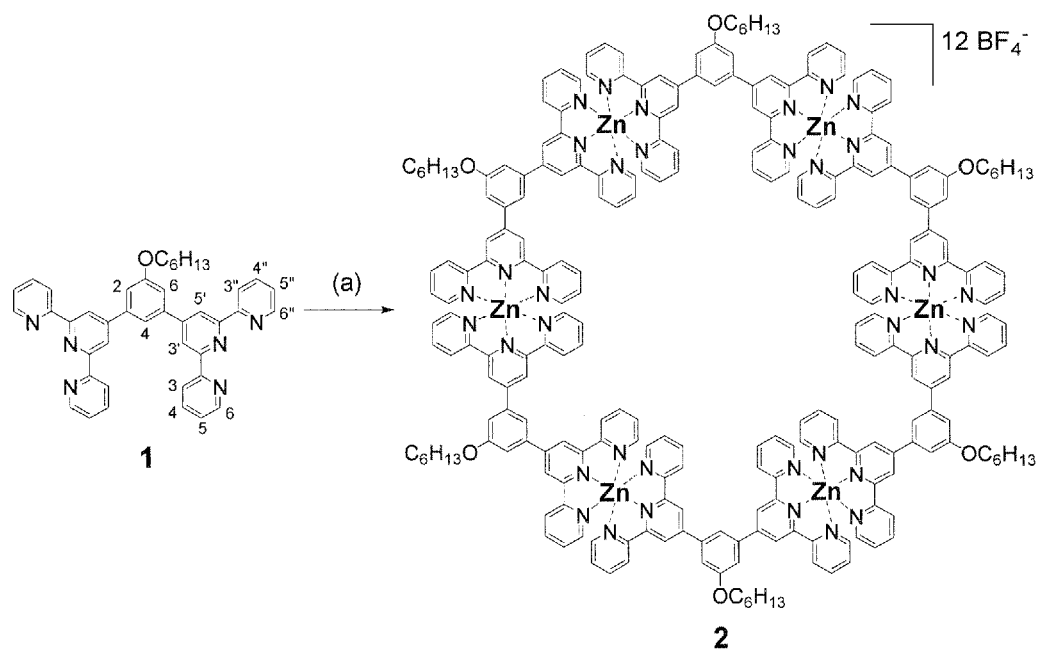
FIG. 1 is a schematic representation of the self-assembly of a metallomacrocycle of the present invention.

Treatment of bisterpyridine 1, as seen in FIG. 1, with one equivalent of $Zn(BF_4)_2 \cdot 4H_2O$ in MeCN for 12 h at 75° C. resulted in the self-assembled hexameric complex $[Zn_6(1)_6(BF_4)_{12}]$ (2; FIG. 1). In particular, O-Hexyl-bisterpyridine (1; 30 mg) was dissolved in MeCN (20 ml), following a solution of $Zn(BF_4)_2 \cdot 4H_2O$ (one equivalent) in MeOH (10 ml) was slowly drop-wise at 26° C., the pale yellow solution was refluxed overnight. After precipitation from diethyl ether, a yellow powder was collected (>75%).

The $^1H$ NMR spectrum of 2 revealed two sharp singlets at 8.01 (2,6-ArH) and 8.55 ppm (3-ArH). These sharp peaks demonstrate the presence of a single homogenous environment for all such groups; this is in contrast to the broadened or multiple signals that is expected for linear oligomers. The observed upfield shift for the doublet at 7.94 ppm (6,6"-tpyHs; $\Delta\delta=-0.81$) and downfield shift for the singlet at 9.25 ppm (3',5'-tpyHs; $\Delta\delta=0.46$), when compared to the absorptions for the uncomplexed starting material, also confirm the symmetry associated with macrocyclization. Lastly, the hexagonal motif was established (ESI-MS) by the definitive signals for multiple-charged entities ranging from the +5 to +7 charge states derived from the loss of $(BF_4^-)_n$.

Figure 2:
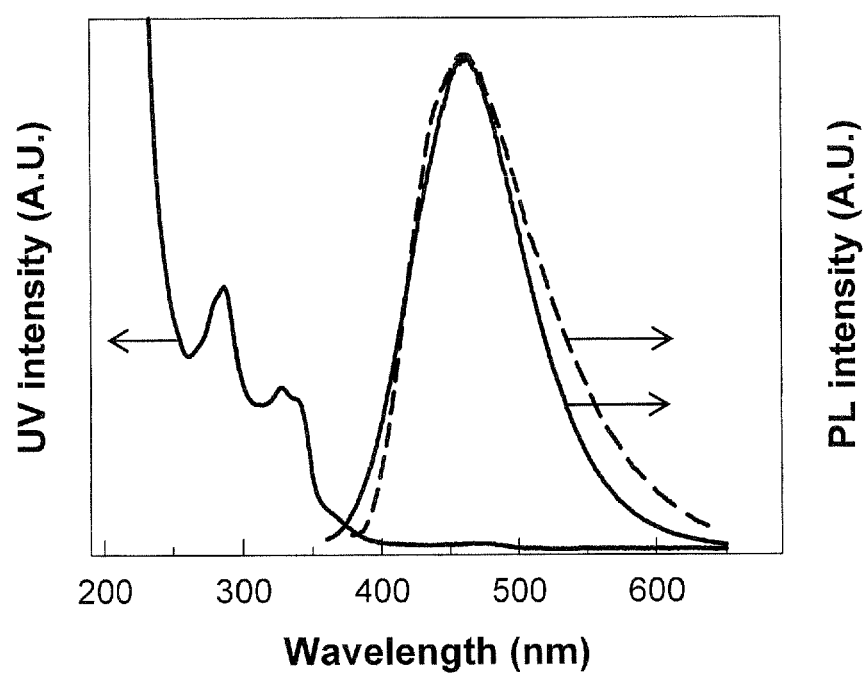
FIG. 2 is a UV/Vis and photoluminescence spectra of a metallomacrocycle of the present invention.

The UV/Vis absorption and photoluminescence (PL) spectra of this Zn(II)-hexamer is shown in FIG. 2. UV/Vis absorption spectrum was obtained on Hewlett-Packard UV/Vis spectrophotometer, and is shown at 10. Photoluminescence (PL) spectra were obtained using a Perkin-Elmer LS55 luminescence spectrometer, with the PL spectra under THF solution at 12 and film at 14. The EL spectrum and brightness of the device were measured with a PR650 Spectra Scan under 25° C. The electrochemical experiments reported in this work were performed using a BAS Epsilon potentiostat. The major absorption bands at $\lambda_{max}$=326 and 368 nm originating from intra-ligand charge transfer ($^1$ILCT) are observed without metal-ligand charge transfer (MLCT) peaks; the MLCT of Zn(II) metal to terpyridine can be excluded. The PL in a THF solution at 25° C. shows a blue emission [Commission Internationale de l'Eclairage (CIE) coordinates: x=0.17, y=0.18] at $\lambda_{max}$=463 nm. The PL in a solid film (thickness: 100 nm) is nearly identical (CIE coordinates: x=0.20, y=0.23) to that in THF solution. This implies that there is no noticeable effect of the charged complexes on the emission wavelength. Using charged iridium complexes, large (up to 80 nm) shifts in the emission spectra have been observed when changing from solution to solid film. This leads to the conclusion that the PL of Zn(II)-hexamer is less sensitive to its medium than the tris-chelated charged iridium complexes.

In order to test the photo- and electroluminescent properties of the metallomacrocycles of the present invention, an LED device was prepared. In particular, the electroluminescent device was prepared on indium tin oxide (ITO) glass (sheet resistance: 20 Ω/sq), which was cleaned sequentially with a detergent solution, deionized water, ethanol, and acetone. Poly(3,4-ethylenedioxythiophene) (PEDOT, 40 nm), N,N'-diphenyl-N,N'-di(1-naphthyl)-1,1'-biphenyl-4,4'-diamine (α-NPD, 20 nm), and Zn(II)-hexamer 2 were blended with 4 wt. % of 4,4'-[bis(9-ethyl-3-carbazovinylene]-1,1'-biphenyl (BCzVBi, 30 nm), 2,9-dimethyl-4,7-diphenyl-1,10-phenanthroline (BCP, 20 nm), and tris(8-hydroxyquinoline)aluminum ($Alq_3$, 20 nm) that was deposited on the ITO glass in a standard spin-coating manner. Metallization of the cathode was conducted at $7 \times 10^{-7}$ Torr to deposit 1 nm of LiF and 100 nm of Al.

The cyclic voltammogram of this Zn(II)-hexamer coated on ITO glass was measured in a conventional three-electrode cell configuration with a Pt gauze counter electrode, a $Ag/Ag^+$ reference electrode, and a 0.1 M tetrabutylammonium hexafluorophosphate ($TBAPF_6$), as the electrolyte, in DMF. The Zn(II)-hexamer exhibited only terpyridinyl-centered reduction couples, which are reversible one-electron couples for successive reduction of the two coordinated terpyridinyl centers at −1.66 and −1.85 V, respectively. As expected, there are no metal-centered redox processes because the d-shell of the Zn(II) metal ion in the complex is completely filled. Hence, the highest occupied molecular orbital (HOMO: −5.8 eV) and lowest occupied molecular orbital (LUMO: −2.3 eV) levels are estimated by their reduction potentials and optical band gaps. The energy gap between the HOMO and LUMO level of Zn(II)-hexamer is 3.5 eV.

The thermal stability of this Zn(II)-hexamer was studied by thermogravimetric analysis (TGA) which showed the decomposition temperature to be 405° C. under a nitrogen atmosphere. This material possesses good thermal stability supporting its suitability for electronic device applications.

This Zn(II)-hexamer was fabricated into an electroluminescent device with the following configuration: ITO/PEDOT/NPD/Zn(II)-hexamer:BCzVBi/BCP/$Alq_3$/LiF/Al.

Figure 3A:
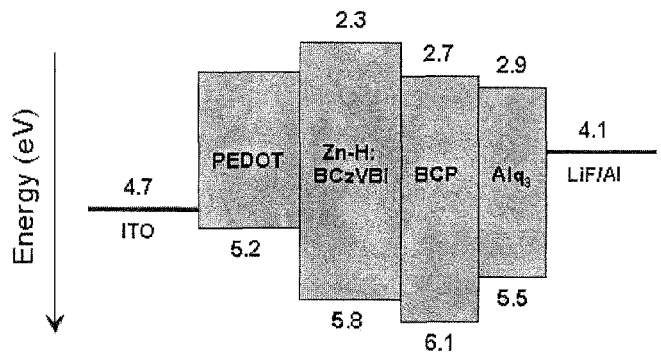
FIG. 3A is a schematic diagram of the energy levels for OLED device components of the present invention, wherein PEDOT, BCzVBi, BCP, and Alq$_3$ represent poly(3,4-ethylenedioxythiophene), 4,4'-[bis(9-ethyl-3-carbazovinylene]-1,1'-biphenyl, 2,9-dimethyl-4,7-diphenyl-1,10-phenanthroline, and tris(8-hydroxyquinoline)aluminum, respectively.
Figure 3B:
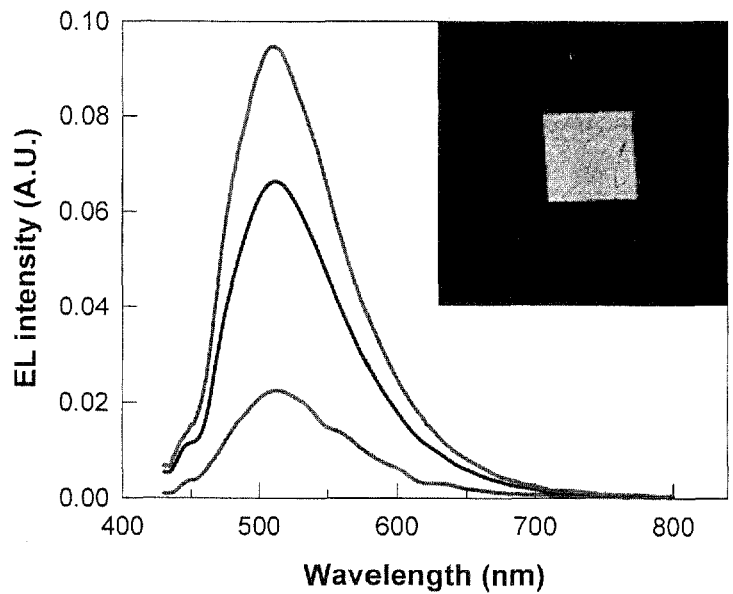
FIG. 3B is an electroluminescence spectra OLED device of the present invention at 10 mA/cm$^2$ (I), 50 mA/cm$^2$ (II), and 100 mA/cm$^2$ (III) current density, respectively; EL emission image (inset)
Figure 4:
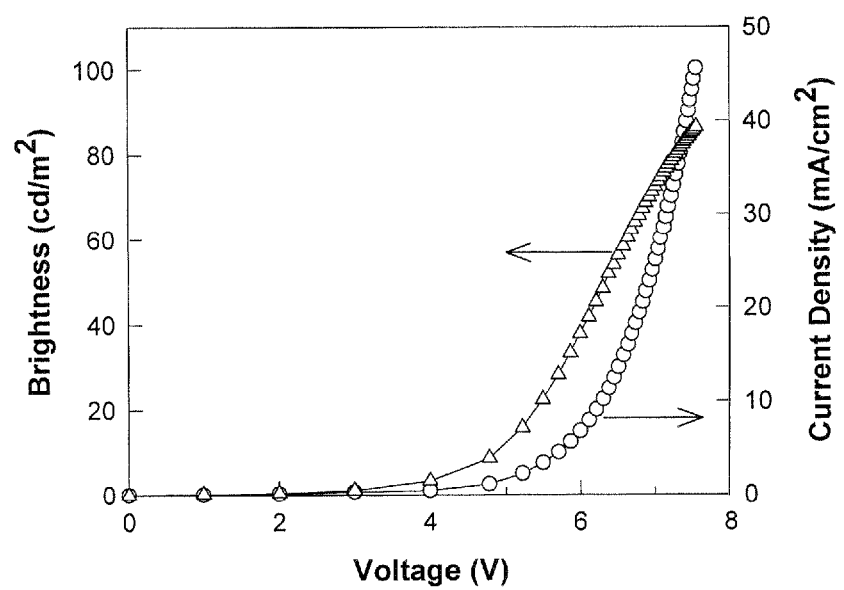
FIG. 4 is a current-voltage (circle) and brightness-voltage (triangle) measurements of the OLED device of the present invention.

FIG. 3A schematically depicts the relative HOMO and LUMO energies of the OLED device components, where PEDOT, BCzVBI, BCP, and Alq₃ represent poly(3,4-ethylenedioxythiophene), 4,4'-[bis(9-ethyl-3-carbazovinylene]-1,1'-biphenyl, 2,9-dimethyl-4,7-diphenyl-1,10-phenanthroline, and tris(8-hydroxyquinoline)aluminum, respectively. The electroluminescence (EL) spectrum of this LED device at a bias voltage of 6.9 V shows an emission with peak maxima at 515 nm, as seen in FIG. 3B, at 10 mA/cm² current density as shown at 20, at 50 mA/cm² current density as shown at 22, and 100 mA/cm² current density as shown at 24, respectively. There is also shown the EL emission image as an inset in FIG. 3B. At all forward-applied bias-voltages, only a green emission at $\lambda_{max}$=515 nm was realized. These EL spectral results confirmed that the Zn(II)-hexamer functioned as an electron-transport material in the LED device. The current density-voltage-luminance (I-V-B) characteristics curve is shown in FIG. 4, with the current-voltage measurements of the OLED device shown at 30, and brightness-voltage measurements of the OLED device shown at 32, according to an example of the present invention. The turn-on voltage is ~4 V and the device has a maximum efficiency of 0.16 cd/A. The maximum luminance of 39 cd/m² was obtained under a driving voltage of 7.6 V. The emission color of the device is green (CIE coordinate: x=0.28, y=0.48).

The Zn(II)-terpyridinyl-based hexagonal metallomacrocycle having long alkyl chains to enhance the solubility was readily synthesized by Zn(II)-mediated self-assembly and shown to possess fluorescence, good thermal structural stability, and organic solubility. A green light emission under forward bias potential was obtained in an OLED made from this Zn(II)-hexamer, with an image of the EL emission shown inset in FIG. 3B. By blending this material with other dyes, the invention contemplates the preparation of white-light EL devices that can be used to achieve red-green-blue (RGB) emission by color-filtering technology.

To illustrate the invention, it is shown and described with respect to specific embodiments. This is not intended as a limitation, and other modifications or variations in the specific form shown and described will be apparent to those skilled in the art. The embodiments were chosen and described in order to best explain the principles of the invention and practical applications to thereby enable a person skilled in the art to best utilize the invention and various embodiments with various modifications as are suited to the particular use are contemplated.

The invention claimed is:

1. A method of preparing an electroluminescent device, the method comprising the steps of:
preparing a hexameric metallomacrocycle by reacting a plurality of 3,5-bis(terpyridinyl)phenol-modified compounds with at least one zinc metal complex to form a self-assembled complex;
depositing a mixture comprising the metallomacrocycle onto an indium tin oxide glass sheet;
metallizing a cathode to facilitate the deposition of a layer of a metal halide compound and a layer of conductive metal.

2. The method of claim 1, further comprising the step of blending the metallomacrocycle with at least one other dye.

3. The method of claim 2, further comprising the step of using at least one color filter to form one of a red-green-blue (RGB) emission.

4. The method of claim 1, wherein the mixture is spin-coated onto the indium tin oxide glass sheet.

5. The method of claim 1, wherein the electroluminescent device is a light emitting diode.

6. The method of claim 1, wherein the electroluminescent device is an organic light emitting diode.

7. A metallomacrocycle comprising:
a hexameric, transition metal-terpyridinyl-based complex with alkyl side chains, wherein the complex exhibits measurable photoluminescent and electroluminescent properties, wherein the transition metal is zinc.

8. The metallomacrocycle of claim 7, wherein the metallomacrocycle is deposited on a screen to create a graphical color display.

9. The metallomacrocycle of claim 8, wherein the graphical color display is used in systems selected from the group consisting of a television screen, a computer display, a portable system screen, and advertising and information board applications.

10. A light emitting diode device comprising the metallomacrocycle of claim 7.

11. An organic light emitting diode device comprising the metallomacrocycle of claim 7.

12. A method of preparing a metallomacrocycle, the method comprising the steps of:
reacting a plurality of 3,5-bis(terpyridinyl)phenol-modified compounds with at least one zinc metal complex to form a self-assembled hexameric metallomacrocycle, where the metallomacrocycle exhibits electroluminescent properties.

13. A method of preparing an electroluminescent device, the method comprising the steps of:
preparing a metallomacrocycle by reacting a plurality of 3,5-bis(terpyridinyl)phenol-modified compounds with at least one zinc metal complex to form a self-assembled complex;
depositing a mixture comprising the metallomacrocycle onto an indium tin oxide glass sheet;
metallizing a cathode to facilitate the deposition of a layer of a metal halide compound and a layer of conductive metal, wherein the zinc metal complex is Zn(BF₄)₂·4H₂O.

14. The method of claim 13, wherein the self-assembled complex is a hexameric metallomacrocycle complex, and wherein the bis-terpyridine phenol-modified compounds include O-hexyl-3,5-bis(terpyridine)phenol.

15. The method of claim 1, where the phenol-modified compound is represented by the formula:

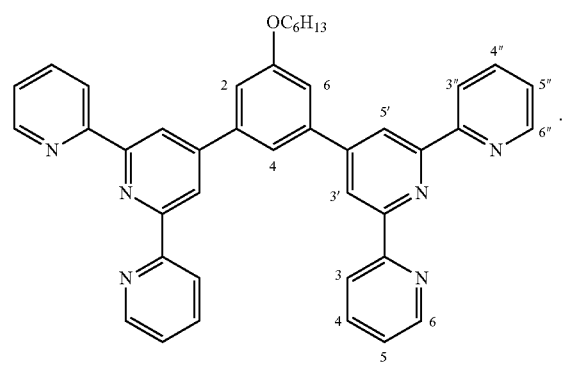

16. The method of claim 15, where the metallomacrocycle is represented by the formula:

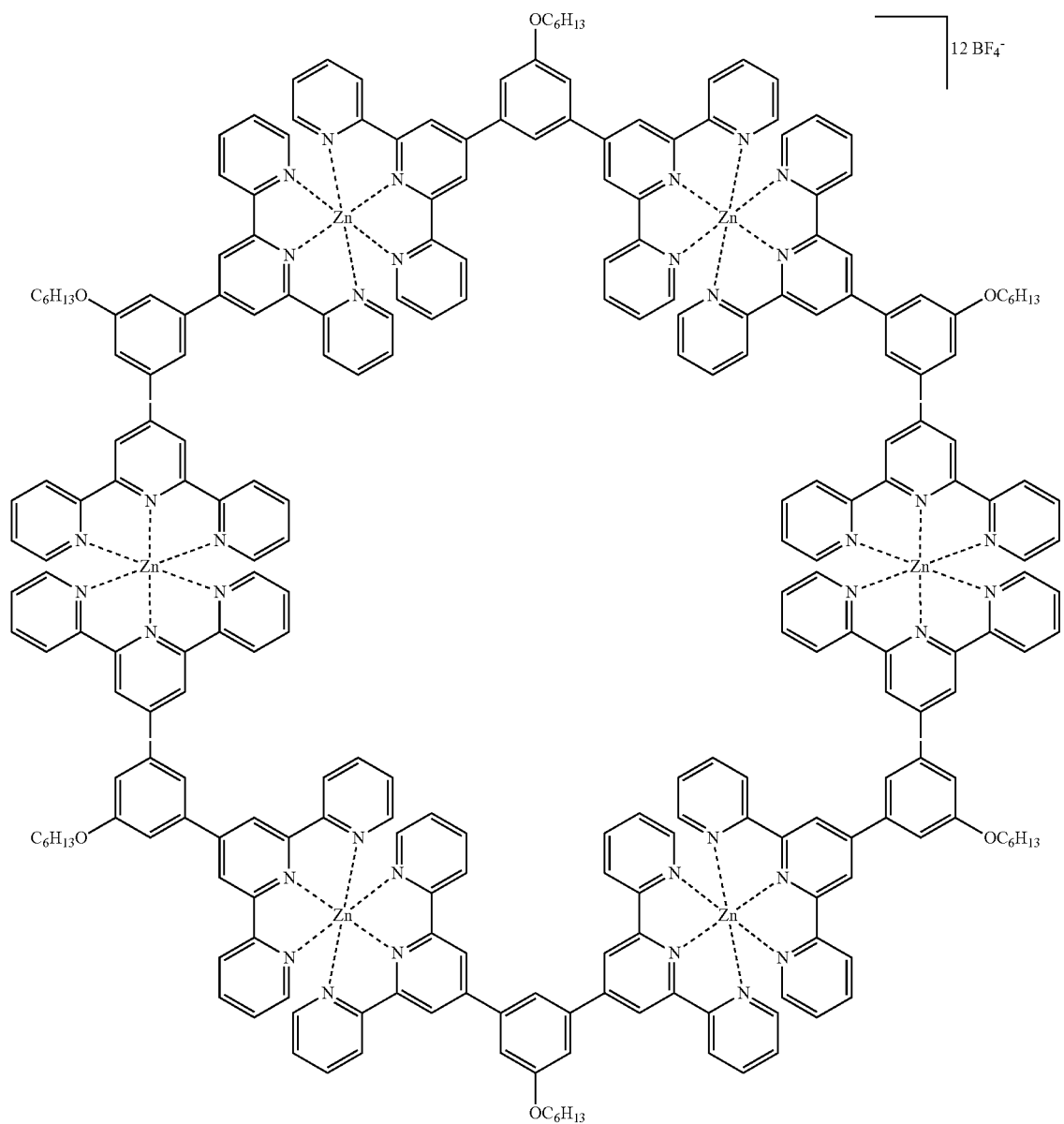
17. The method of claim 13, wherein the bis-terpyridine and the zinc complex are reacted in a molar ratio of about 1:1.
* * * * *